United States Patent
Uchiyama et al.

(10) Patent No.: US 6,785,008 B2
(45) Date of Patent: Aug. 31, 2004

(54) BOARD FOR MEASURING OFFSET OF COMPONENT MOUNTING APPARATUS, AND METHOD FOR MEASURING OFFSET OF COMPONENT MOUNTING APPARATUS

(75) Inventors: Hiroshi Uchiyama, Kofu (JP); Tetsutarou Hachimura, Kofu (JP); Osamu Okuda, Yamanashi-ken (JP); Noriaki Yoshida, Ikeda (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 57 days.

(21) Appl. No.: 09/931,413

(22) Filed: Aug. 17, 2001

(65) Prior Publication Data

US 2002/0029486 A1 Mar. 14, 2002

(30) Foreign Application Priority Data

Aug. 21, 2000 (JP) .................................... 2000-249763

(51) Int. Cl.$^7$ .............................................. G01O 21/00
(52) U.S. Cl. ..................... 356/620; 324/158.1; 324/758
(58) Field of Search ......................... 33/227–299, 701, 33/706–707; 356/72, 138–155, 256, 625–640, 614–624, 399, 401; 324/158.1, 537, 750–772, 538–556

(56) References Cited

U.S. PATENT DOCUMENTS

| | | | | |
|---|---|---|---|---|
| 5,581,353 A | * | 12/1996 | Taylor | 356/381 |
| 5,648,729 A | * | 7/1997 | Yamauchi et al. | 324/758 |
| 5,717,575 A | * | 2/1998 | Copelane et al. | 324/158.1 |
| 5,748,827 A | * | 5/1998 | Holl et al. | 385/134 |
| 5,955,876 A | * | 9/1999 | Yamauchi | 324/158.1 |
| 5,992,013 A | * | 11/1999 | Morita | 29/833 |
| 6,308,428 B1 | * | 10/2001 | Creighton, III | 33/286 |
| 6,447,240 B1 | * | 9/2002 | Cain | 414/694 |

FOREIGN PATENT DOCUMENTS

| | | |
|---|---|---|
| DE | 42 27 667 | 2/1994 |
| EP | 0 473 363 | 3/1992 |
| JP | 9-116242 | 5/1997 |

* cited by examiner

*Primary Examiner*—Frank G. Font
*Assistant Examiner*—Willie Davis
(74) *Attorney, Agent, or Firm*—Wenderoth, Lind & Ponack, L.L.P.

(57) ABSTRACT

An offset measuring board is formed of a rectangular metal plate which can be positioned at a component mounting position by a positioning device and which has at least in proximity to one corner portion thereof a recognition through hole, serving as a recognition mark, having a black bottom face within a recessed portion.

7 Claims, 4 Drawing Sheets

BOARD FOR MEASURING OFFSET OF COMPONENT MOUNTING APPARATUS, AND METHOD FOR MEASURING OFFSET OF COMPONENT MOUNTING APPARATUS

BACKGROUND OF THE INVENTION

The present invention relates to a component-mounting-apparatus offset measuring board, as well as a component-mounting-apparatus offset measuring method, for measuring an offset of a component mounting apparatus that serves to mount components onto a board.

Figure 6:
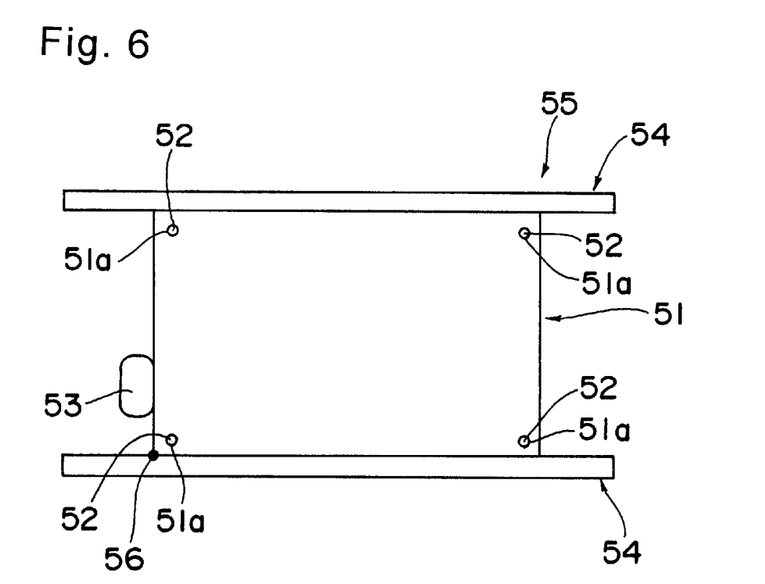
FIG. 6 is a plan view of a state in which a board of the prior art is positioned and held by a positioning device.

Conventionally, a positioning device 55 for positioning to a component mounting position a component mounting board 51 onto which a component is to be mounted has a pair of support rails 54. The device positions and holds the board 51 at the component mounting position through the steps of conveying the board 51 up to a specified component mounting position by the drive of belt conveyors on the individual support rails 54. The board 51 is stopped by its front face making contact with a board stopper 53, and then reference pins 52 are inserted into reference-pin insertion through holes 51a formed near four corner portions of the board, respectively. After that, end edge portions of the board 51 are pinched and held from above and below by the pair of support rails 54 by which the board 51 is positioned and held at the component mounting position.

The mounting program for mounting components onto the board 51 that has been positioned and held at the component mounting position by the positioning device 55 as described above is normally so designed that positional coordinates to which individual components are to be mounted are specified from a program reference position. Therefore, it is of importance to correctly set the program reference position.

Conventionally, a reference pin 52 inserted into one reference-pin insertion through hole 51a of the board 51 positioned and held to the component mounting position is recognized by a board recognition camera, then one corner portion of the board 54 is determined based on positional information as to the recognized reference pin 52 and previously stored coordinate information as to a range from the reference-pin insertion through hole 51a to one corner portion of the board 54, and this corner portion is used as the program reference position 56.

With the above structure, since the reference pin 52 is mechanically incorporated in the positioning device 55, the position of the reference pin 52 inevitably involves errors due to mounting errors or the like. However, for the implementation of high-density component mounting at high precision, even such positional errors of the reference pin 52 as described above become impermissible. Thus, there has been a desire for a method of obtaining the program reference position with a higher degree of precision.

SUMMARY OF THE INVENTION

Accordingly, an object of the present invention is to solve the above-described issues and to provide a component-mounting-apparatus offset measuring board, as well as a component-mounting -apparatus offset measuring method, which allows the program reference position to be obtained with higher precision.

In accomplishing these and other aspects, according to a first aspect of the present invention, there is provided a component-mounting-apparatus offset measuring board for use in measuring an offset of a component mounting apparatus which mounts a component onto a board positioned at a component mounting position by a positioning device.

The component-mounting-apparatus offset measuring board is formed of a rectangular or square metal plate which can be positioned at the component mounting position by the positioning device and which has a recognition mark at least in proximity to one corner portion thereof.

According to a second aspect of the present invention, there is provided a component-mounting-apparatus offset measuring board according to the first aspect, wherein when the board is stopped at the component mounting position by contact with a board stopper of the positioning device, the recognition mark is positioned in proximity to a corner portion closest to the board stopper in the component mounting position. A face of the board with which the board stopper makes contact to stop the board is formed by processing.

According to a third aspect of the present invention, there is provided a component-mounting-apparatus offset measuring board according to the first or second aspect, wherein the rectangular or square metal plate has a recessed portion formed at least in proximity to one corner portion thereof. Also, a recognition through hole is positioned within the recessed portion and is smaller in inner diameter than the recessed portion. The recognition hole has a black bottom face to serve as a recognition mark.

According to a fourth aspect of the present invention, there is provided a component-mounting-apparatus offset measuring board according to the third aspect, wherein the depth of the recessed portion is greater than the depth of the recognition through hole.

According to a fifth aspect of the present invention, there is provided a component-mounting-apparatus offset measuring board according to any one of the first to fourth aspects, wherein a front face, a rear face and both side faces of the rectangular or square metal plate are formed by processing.

According to a sixth aspect of the present invention, there is provided a method for measuring an offset of a component mounting apparatus in a component mounting apparatus which mounts a component onto a board positioned to a component mounting position by a positioning device. The method comprises:

positioning to the component mounting position by the positioning device an offset measuring board formed of a rectangular or square metal plate having a recognition mark at least in proximity to one corner portion thereof;

recognizing the recognition mark to obtain coordinate information as to the recognition mark;

based on the obtained coordinate information as to the recognition mark and coordinate information as to a range from the recognition mark to one corner portion of the offset measuring board closest to the recognition mark, obtaining position coordinate information as to the one corner portion of the offset measuring board; and comparing the obtained position coordinate information as to the one corner portion of the offset measuring board with coordinate information as to an original position of the one corner portion of the offset measuring board preliminarily set as the positioning device to thereby determine offset information therebetween.

According to a seventh aspect of the present invention, there is provided a method for measuring an offset of a component mounting apparatus according to the sixth aspect, wherein:

in positioning the offset measuring board to the component mounting position by the positioning device, the offset measuring board is hit against a board stopper to stop the offset measuring board at the component mounting position; and in recognizing the recognition mark to obtain the coordinate information as to the recognition mark, the recognition mark in proximity to a corner portion closest to the board stopper in the component mounting position is recognized.

According to an eighth aspect of the present invention, there is provided a method for measuring an offset of a component mounting apparatus according to the sixth or seventh aspect, wherein:

in recognizing the recognition mark to obtain the coordinate information as to the recognition mark, a recognition through hole which is positioned within a recessed portion formed at least in proximity to one corner portion of the offset measuring board and which is smaller in inner diameter than the recessed portion and has a black bottom face is recognized as the recognition mark.

BRIEF DESCRIPTION OF THE DRAWINGS

These and other aspects and features of the present invention will become clear from the following description taken in conjunction with the preferred embodiments thereof with reference to the accompanying drawings, in which.

DETAILED DESCRIPTION OF THE PREFERRED EMBODIMENTS

Before the description of the present invention proceeds, it is to be noted that like parts are designated by like reference numerals throughout the accompanying drawings.

A component-mounting-apparatus offset measuring board 1 to be used in a component-mounting-apparatus offset measuring method according to a first embodiment of the present invention, as shown in FIGS. 1 to 5, is formed as a rectangle or square, that is, a right-angled quadrilateral metal plate which can be positioned in a component mounting position by a component-mounting-apparatus positioning device 19 and which has a recognition mark 3 at least in proximity to one corner portion thereof.

Figure 5:
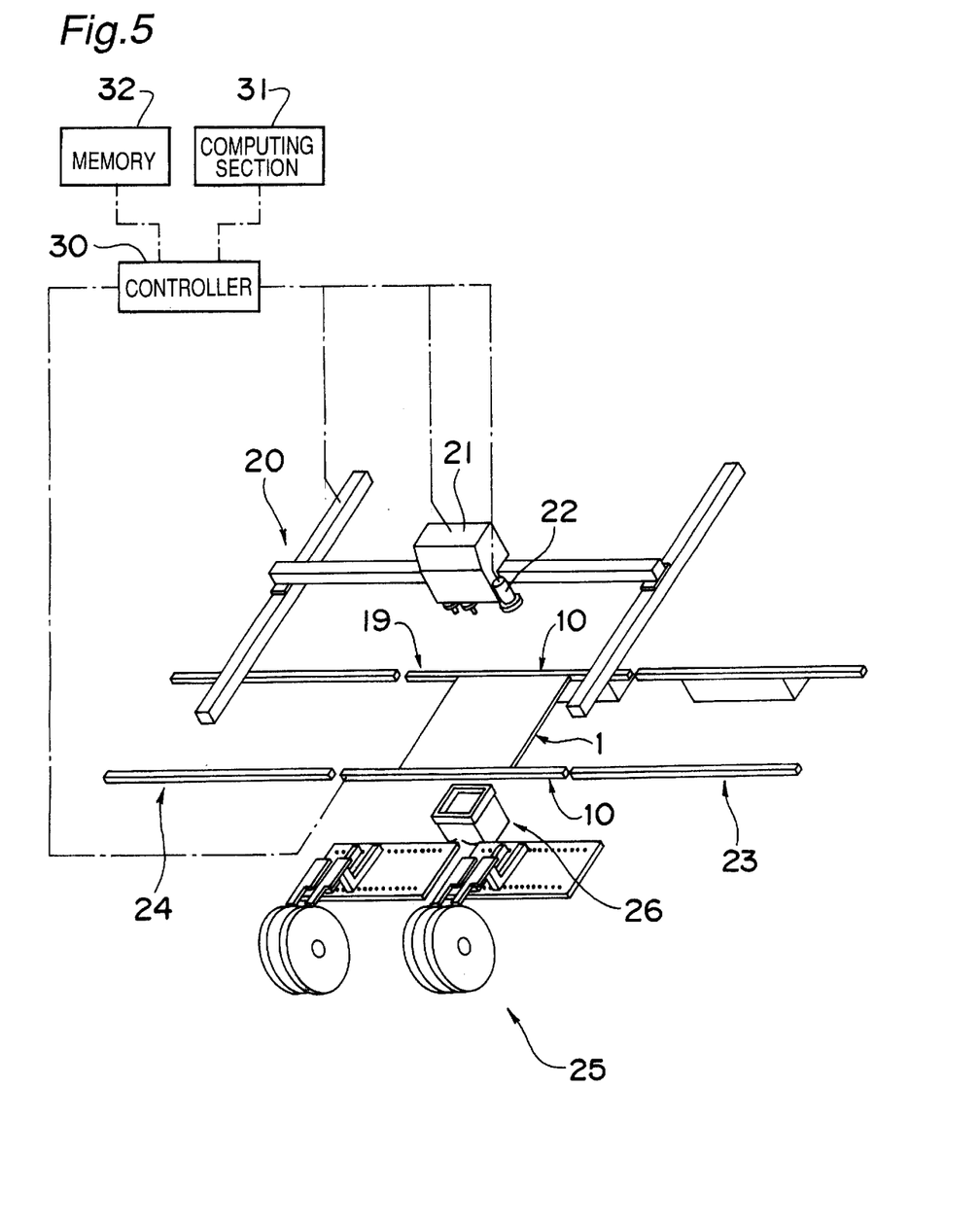
FIG. 5 is a perspective view of a state in which the offset measuring board is positioned and held by the positioning device.

The component mounting apparatus performs the following steps, as an example. As shown in FIG. 5, a board on which components are to be mounted (although the offset measuring board 1 is shown in FIG. 5, the board on which components are to be mounted also has a similar outer shape) and which has been conveyed up to a positioning device 19 by a loader 23 is positioned and held by the positioning device 19, an X-Y robot 20 is driven based on a mounting program within a memory 32 under the control of a controller 30 so that a mounting head 21 is moved to a component feed cassette 25, components fed from the component feed cassette 25 are sucked and held by nozzles of the mounting head 21, postures of the components are recognized by a component recognition camera 26, and thereafter, while their postures and the like are corrected based on recognition results, the components sucked and held by the mounting head 21 are mounted onto the board. After all the components are mounted onto the board, the board is conveyed out from the positioning device 19 via an unloader 24. A board recognition camera 22, which is mounted on the mounting head 21, performs the recognition of the board and is also used for the recognition of the recognition mark in this embodiment.

Figure 1A:
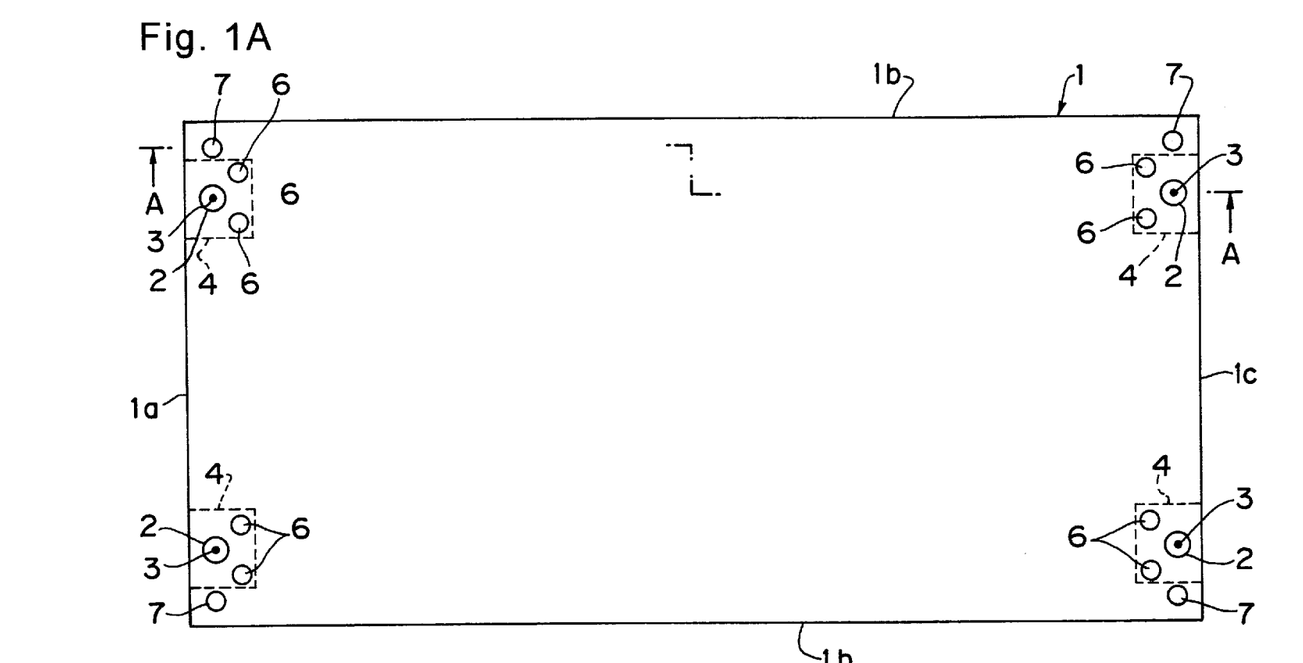
FIGS. 1A and 1B are a plan view of the component-mounting-apparatus offset measuring board to be used in the component-mounting-apparatus offset measuring method according to one embodiment of the present invention, and a sectional view taken along line A—A of FIG. 1A of the offset measuring board, respectively.
Figure 1B:
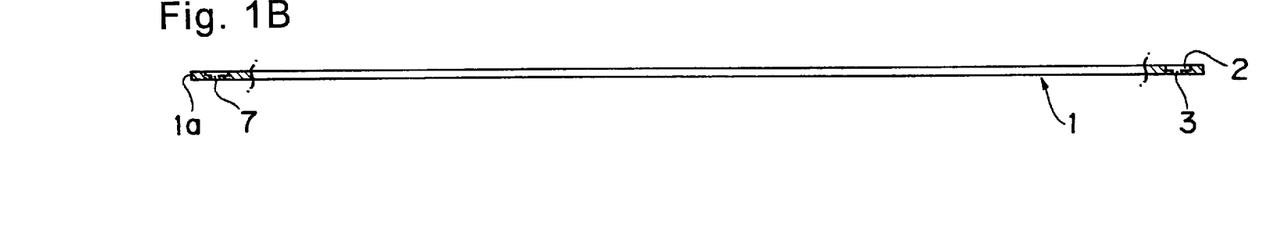
Figure 2:
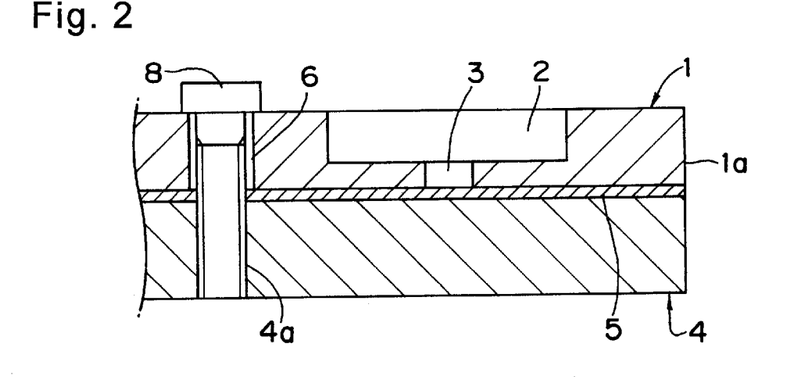
FIG. 2 is an enlarged sectional view taken in proximity to a recessed portion of the offset measuring board.

More specifically, the offset measuring board 1 is, as one example, rectangular-plate shaped and metallic colored, and has, in proximity to each of its four corner portions, a circular recessed portion 2, and a circular recognition through hole 3 positioned at the center of the recessed portion 2. The recognition through hole 3 is smaller in inner diameter than the recessed portion 2 and has a black bottom face to serve as a recognition mark.

The material of the offset measuring board 1 is preferably iron or sheet metal. For example, a front face 1a, a rear face 1c, and both side faces 1b of an iron or other like metal plate are formed by processing (machining work) so that the front face 1a and the rear face 1c become planar surfaces while both side faces 1b become parallel to each other, and that the front face 1a and the rear face 1c and the two side faces 1b are perpendicular to each other. This processing can be performed by pressing, cutting, laser beam machining, wire cutting, or the like. In proximity to each of the four corner portions of the offset measuring board 1, a circular recessed portion 2 is formed by pressing, electric discharge machining, end mill or other cutting work, or the like, and a circular recognition through hole 3 which is positioned at the center of the recessed portion 2, smaller in inner diameter than the recessed portion 2 and having a black bottom face to serve as a recognition mark is formed through by end mill or other cutting work, drilling, laser beam machining, wire machining, or the like. The recognition through hole 3 is preferably formed at a central portion of the recessed portion 2 in terms of the processing process, but is not limited to this. Further, the reason why the recognition through hole 3 is formed within the recessed portion 2 is that with a large plate thickness of the offset measuring board 1, an attempt at recognition with one recognition through hole would be accompanied by the recognition of the inner wall of the recognition through hole so that top profile and bottom profile of the recognition through hole would be recognized doubly, making it hard to recognize the bottom profile correctly and with high precision. Therefore, by forming the recognition through hole 3 within the recessed portion 2 and by making the recognition through hole 3 smaller in thickness than the recessed portion 2, the inner wall part of the recognition through hole 3 is made limitlessly small and less recognized, thus allowing only the bottom profile of the recognition through hole 3 to be recognized with high degree of precision. In addition, the recessed portion 2 may be formed in any arbitrary shape without being limited to a circular shape.

As a specific example, in proximity to each of the individual corner portions of a 100 mm wide, 200 mm long, and 1.6 mm thick rectangular offset measuring board 1 are formed a recessed portion 2 having an inner diameter of 5 mm and a depth of 1.1 mm and a recognition through hole 3 which is positioned within the recessed portion 2 and which has an inner diameter of 1 mm and a depth of 0.5 mm.

Figure 3:
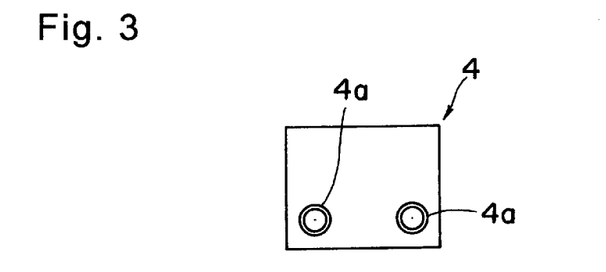
FIG. 3 is an enlarged plan view of a patch plate to be fitted to the offset measuring board.

In order that the bottom face of the recognition through hole 3 formed through the metal plate is black-colored, an oblong patch plate 4 having a black layer 5 on its top surface is fixed by bolts 8 to the lower surface of the proximity to each corner portion of the offset measuring board 1. That is, two bolt through holes 6 are formed in the offset measuring board 1 near the recognition through hole 3 and on one side thereof lengthwise closer to the center. Then, the two bolts 8 are inserted through the bolt through holes 6 so as to be screwed into screw holes 4a of the patch plate 4, by which the patch plate 4 is fixed to each corner portion of the offset measuring board 1 with the bolts 8. The patch plate 4 is formed from sheet-formed iron having a black surface.

Outside and near the recessed portion 2 in proximity to each corner portion of the offset measuring board 1, a reference-pin insertion through hole 7 for inserting a reference pin 18 of the positioning device 19 therethrough is formed so that the offset measuring board 1 can be positioned and held.

The offset measuring method using the offset measuring board 1 of the above construction is explained below. Here is described a case in which a recognition through hole 3 of the offset measuring board 1 closest to a board stopper 12, for example, a left lower recognition through hole 3 in FIG. 1 is used as an example of the recognition mark.

Whereas a program reference position 16 is given by a position that serves as the coordinates of the origin in specifying, in the mounting program, coordinates of specified places of the board onto which components are to be mounted in the component mounting apparatus, the term "offset" in the following description refers to an amount of positional shift between an original position as the program reference position 16 and an actual program reference position 16 actually determined by using the offset measuring board 1.

Figure 4:
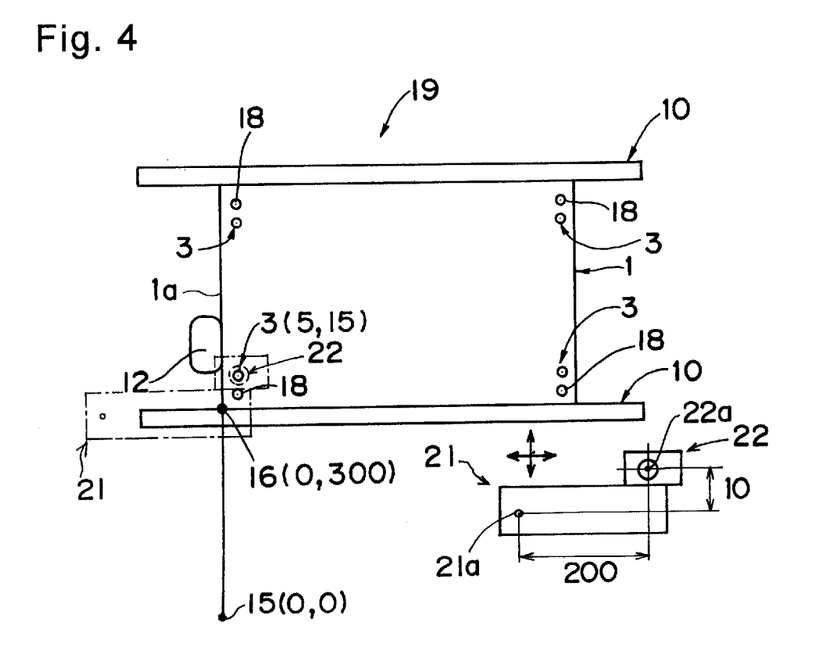
FIG. 4 is a plan view of a state in which the offset measuring board is positioned and held by a positioning device.

First, the positioning device 19 is preliminarily adjusted in width so that its width matches the width of the offset measuring board 1. The positioning device 19 has a pair of support rails 10, where at least one support rail 10 out of the one pair of support rails 10 is made widthwise movable with respect to the other support rail 10 so that the width between the one pair of support rails 10 is changeable according to the width of the offset measuring board 1. Before the offset measuring board 1 is carried into the positioning device 19, one support rail 10 is moved widthwise with respect to the other support rail 10 in accordance with the width of the positioning device 19, by which the width adjustment is achieved.

Next, as shown in FIG. 5, the offset measuring board 1 is carried into the positioning device 19 by the loader 23, and further conveyed up to a specified component mounting position by driving a belt conveyor of each support rail 10, until the front face 1a of the offset measuring board 1 is brought into contact, and thereby stopped, with the board stopper 12 at the component mounting position as shown in FIG. 4 so that the offset measuring board 1 is stopped at the component mounting position, and then the belt conveyors are halted. Thereafter, the offset measuring board 1 is pinched at its end edge portions on the sides of the side faces 1b from above and below, and thereby held, by the one pair of support rails 10. Thus, the offset measuring board 1 is positioned and held at the component mounting position.

Next, the reference pins 18 of the positioning device 19 are inserted upward from down below into the reference-pin insertion through holes 7 in proximity to the individual corner portions of the offset measuring board 1, respectively, so that the offset measuring board 1 is positioned and held in the component mounting position.

Next, the mounting head 21 having the board recognition camera 22 is driven by the X-Y robot 20 so that the board recognition camera 22 is moved to a location above the left lower recognition through hole 3 in FIG. 1, which is the recognition through hole 3 of the offset measuring board 1 closest to the board stopper 12. In this process, since positional information as to the center of the left lower recognition through hole 3 in FIG. 1 of the offset measuring board 1 has preliminarily been read from the memory 32 into the controller 30 and further transferred to the X-Y robot 20, the board recognition camera 21 is enabled to take the left lower recognition through hole 3 within its field of view.

Next, the left lower recognition through hole 3 in FIG. 1 of the offset measuring board 1 is recognized under illumination by the board recognition camera 22 with white illuminating light, coordinates of the center position of the recognized recognition through hole 3 are determined by a computing section 31, and the shift amount from the original position is computed by the computing section 31, by which the positional shift amount is determined. The positional shift amount of the center of the left lower recognition through hole 3 in FIG. 1 determined in this way is stored in the memory 32.

Next, coordinates of the program reference position 16 are determined from the X-Y coordinates, which are the coordinate system on which the mounting head 21 driven by the X-Y robot 20 operates. The above positional shift amount, the offset amount of the board recognition camera 22 from its original position that has occurred during its fitting onto the component mounting apparatus, and the distance from the left lower recognition through hole 3 in FIG. 1 of the offset measuring board 1 to an end point of the offset measuring board 1 closest to the board stopper 12, i.e., the left lower corner portion in FIG. 1, and the determined coordinates are stored into in the memory 32.

Specifically, X- and Y-coordinates of the program reference position 16 can be determined by the following equations:

X-coordinate of program reference position 16=(ANS1)−(parameter PX for range from end point of offset measuring board 1 to recognition through hole 3) (Eq. 1)

Y-coordinate of program reference position 16=(ANS2)−(parameter PY for range from end point of offset measuring board 1 to recognition through hole 3) (Eq. 2)

In this case, the parameter PX, which is a value preliminarily stored in the memory 32, indicates the X-coordinate of the center position of the recognition through hole 3 because the end point of the offset measuring board 1 serves as the origin of coordinates. The parameter PY, which is a value preliminarily stored in the memory 32, indicates the Y-coordinate of the center position of the recognition through hole 3 because the end point of the offset measuring board 1 serves as the origin of coordinates on the program basis. For example, the parameter PX is +5 and the parameter PY is +15. Further, ANS1 and ANS2 can be determined by the following equations:

(ANS1)=(X-coordinate of mounting head 21 with current board recognition camera 22 positioned at recognition through hole 3)−(X-coordinate of board recognition camera 22 by offset)+(X-coordinate of recognition through hole 3 by recognition result)     (Eq. 3)

(ANS2)=(Y-coordinate of mounting head 21 with current board recognition camera 22 positioned at recognition through hole 3)−(Y-coordinate of board recognition camera 22 by offset)+(Y-coordinate of recognition through hole 3 by recognition result)     (Eq. 4)

As an example, when the offset measuring board 1 is 100 mm long and 200 mm wide, initial-setting (default) coordinates of the program reference position 16 are assumed to be (0, 300) on the basis of a machine origin point (0, 0) as shown in FIG. 4. It is also assumed that with the use of the left lower recognition through hole 3 in FIG. 4, the left lower recognition through hole 3 is (5, 15) away in coordinate value from the program reference position 16. It is further assumed that a center position 22a of the board recognition camera 22 is offset by (−200, −10) in coordinate value from the positioning center (actually, the center of a suction nozzle at one end of the mounting head 21) 21a of the mounting head 21. It is still also assumed that a recognition result of the recognition through hole 3 is, for example, (+1, −1) as coordinate values, with the current board recognition camera 22 positioned just above the left lower recognition through hole 3. Then, since the mounting head 21 is positioned at (−200, −10) from the board recognition camera 22, the X-coordinate of the mounting head 21 with the current board recognition camera 22 positioned at the recognition through hole 3 results in "−195" from an offset amount of "200" and an X-coordinate of "5" of the recognition through hole 3. Since the X-coordinate of the board recognition camera 22 by the offset is "−200" and the X-coordinate of the recognition through hole 3 by the recognition result is "+1," it follows from Eq. 3 that (ANS1)=(X-coordinate of mounting head 21 with current board recognition camera 22 positioned at recognition through hole 3)−(X-coordinate of board recognition camera 22 by offset)+(X-coordinate of recognition through hole 3 by recognition result)=−195−(−200)+1=6

Also, since the mounting head 21 is positioned at (−200, −10) from the board recognition camera 22, the Y-coordinate of the mounting head 21 with the current board recognition camera 22 positioned at the recognition through hole 3 results in "305" from an offset amount of "10," the default Y-coordinate of "300" of the program reference position 16 and the Y-coordinate of "15" of the recognition through hole 3. Since the Y-coordinate of the board recognition camera 22 by the offset is "−10" and the Y-coordinate of the recognition through hole 3 by the recognition result is "−1," it follows from Eq. 4 that (ANS2)=(Y-coordinate of mounting head 21 with current board recognition camera 22 positioned at recognition through hole 3)−(Y-coordinate of board recognition camera 22 by offset)+(Y-coordinate of recognition through hole 3 by recognition result)=305−(−10) +(−1)=314

Thus, it results from Eq. 1 and Eq. 2 that

X-coordinate of program reference position 16=(ANS1) −(parameter PX for range from end point of offset measuring board 1 to recognition through hole 3)=6−5=1

Y-coordinate of program reference position 16=(ANS2) −(parameter PY for range from end point of offset measuring board 1 to recognition through hole 3)=314−15 =299.

Consequently, the actual coordinates of the program reference position 16 result in (1, 299), from which the shift from the initial-setting (default) coordinates (0, 300) of the program reference position 16 can be known.

Next, the offset measuring board 1 is conveyed to the post-processing side, and positioned at the next component mounting position of the component mounting apparatus. After the above-described operations are iterated, the offset measuring board 1 is taken out.

Based on the coordinates of the program reference position 16 determined in this way, the component mounting operation is performed by the component mounting apparatus. Referring to the actual movement of the mounting head of the component mounting apparatus, usually, the mounting head 21, which is kept on standby at a machine origin point 15 (see FIG. 4), is driven upon a start of a mounting operation, by taking into consideration coordinate differences between the machine origin point 15 and the above-determined program reference position 16. In addition, the machine origin point 15 may be given by the origin position of the board recognition camera 22.

According to the above-described embodiment, since the offset measuring board 1 is formed of a metal plate having a recognition mark 3 at least in proximity to one corner portion thereof, the front face 1a, rear face 1c and both side faces 1b of the offset measuring board 1 can be formed with low cost and high degree of precision by the aforementioned processing, and moreover as the recognition mark 3, for example, a through hole 3 can be formed within the recessed portion 2 with low cost and high precision. As a result of this, the front face 1a and the rear face 1c of the offset measuring board 1 can be formed with high precision for their planarity, for example, within ±0.1 mm, and moreover both side faces 1b can be formed with high precision for their parallelism, for example, within ±0.05 mm while a high degree of orthogonality of the front face 1a and the rear face 1c relative to the two side faces 1b can be obtained with high precision, for example, within ±0.05 mm. In connection with this, it is important to finish with high precision the planarity of the front face 1a and the rear face 1c of the offset measuring board 1, which largely affects the positional precision involved in stopping the front face 1a and the rear face 1c by contact with the board stopper. Also, the parallelism between both side faces 1b of the offset measuring board 1 largely affects the positioning and holding of the offset measuring board 1 by pinching the offset measuring board 1 between the support rails 10 of the positioning device 19, where poor parallelism precision would cause the positional precision of the recognition mark to also deteriorate due to the positioning and holding by pinching the board with the support rails 10. Further, the degrees of orthogonality of the front face 1a and the rear face 1c to both side faces 1b of the offset measuring board 1 largely affect the coordinate precision in the X- and Y-directions.

In contrast to this, when an offset measuring board having a similar construction is made from a material other than metals, for example, glass, it is impossible with glass to form the recessed portions 2 or the recognition through holes 3 by cutting or other work, making it difficult to form the offset measuring board. Also, in the case of a board made of a material other than metals, for example, glass-epoxy resin, it is difficult to form the front face 1a, the rear face 1c, and both side faces 1b with high precision in terms of material properties, and moreover the material itself is flexure-prone. Therefore, even if the board is brought into contact with the board stopper 12 so as to be stopped at the component mounting position, a high-precision positioning and holding of the board could not be achieved because of the poor planarity of the front face that makes contact with the board stopper 12, which causes a poor parallelism between the two side faces which matters in pinching the board by both-side support rails after the contact and stop, and also because of the poor degrees of orthogonality between the side faces and the front face.

However, in the case where, as in the above-described embodiment, the offset measuring board 1 is formed from metal, where its front face 1a, rear face 1c and both side faces 1b are formed by processing as described above and where the recessed portions 2 and the through holes 3 are formed by end mill or other cutting work, it becomes possible to remarkably improve the planarity of the front face 1a which is to be brought into contact, and thereby stopped, with the board stopper 12, the degree of parallelism between both side faces 1b which are to be pinched by both-side support rails 10 after the contact and stop by the board stopper 12, and the precision of the degrees of orthogonality between the side faces 1b and the front face 1a, as compared with a board formed of glass-epoxy resin.

Also, since the offset measuring board 1 is less flexure-prone than boards of resin by virtue of its being made of metal, and since the face of the offset measuring board 1 to be brought into contact, and thereby stopped, with the board stopper 12 can be formed by the aforementioned processing as described above, the offset measuring board 1 can be finished with higher precision than boards of resin. Thus, the offset measuring board 1, when positioned at the component mounting position after being stopped by the board stopper 12, can be positioned and held with higher precision, where the positioning precision can be improved, for example, up to about 1/100 mm in terms of positioning precision error.

Besides, using the recognition through hole 3, which is closest to the board stopper 12 out of the four recognition through holes 3, makes it possible to further improve the offset measuring precision.

Furthermore, the recognition through hole 3 is formed in the recessed portion 2, which is larger in inner diameter than the recognition through hole 3 and is formed before the recognition through hole 3 is formed within the recessed portion 2. Thus, the inner wall of the recognition through hole 3 can be made less recognizable by reducing the thickness of the part where the recognition through hole 3 is formed, based on the arrangement that with the field of view of the board recognition camera 22 set within the recessed portion 2, the recognition through hole 3 is formed at a part within the recessed portion 2 and quite smaller in thickness with respect to the thickness of the whole offset measuring board 1. As a result of this, the profile of the opening of the recognition through hole 3 on its bottom-face side can be recognized clearly and with high precision, so that the recognition precision can be improved, and moreover that the program reference position can be obtained with higher precision.

Also, as compared with the case where the reference pin of the reference-pin insertion through hole is recognized by the board recognition camera, the need for forming the reference-pin insertion through holes is eliminated so that the labor and cost for processing can be reduced, and moreover the need for providing the reference pins as well as the need for adjusting the reference pins in model changes of the board can also be eliminated.

It is noted here that the present invention is not limited to the above embodiment and may be embodied in other various modes.

For example, in the foregoing embodiment, both front face 1a and rear face 1c are formed by the aforementioned processing as those faces which are positionally restricted by the board stopper 12 of the offset measuring board 1 so that higher precision can be obtained. However, in the case where either one of the front face 1a or the rear face 1c is positioned by the board stopper 12, the one face alone has only to be formed with high precision by the processing. Further, as to the recognition marks 3, if the other recognition marks 3 are unnecessary, forming at least one recognition mark 3 will do without forming four recognition marks 3.

Also, in the above embodiment, when a plurality of component mounting apparatuses are connected, the program reference position 16 is determined for each of the plurality of component mounting apparatuses. However, the present invention is not limited to this. For example, instead of iterating the above operations in each component mounting apparatus, coordinates of the program reference position 16 determined by one of the component mounting apparatuses may be used as teaching information in the other component mounting apparatuses. In this case, the operation of determining the coordinates of the program reference position 16 in the other component mounting apparatuses is no longer necessary, while use of the same coordinates of the program reference position 16 in the other component mounting apparatuses makes it less likely to occur that the precision of mounting operation differs among the component mounting apparatuses, so that the component mounting board becomes more stable in quality.

Also, in the above embodiment, the program reference position 16 is given by an end point closest to the board stopper 12, i.e., a left lower corner portion in FIG. 1, but the reference position is not limited to this. That is, the program reference position 16 may be given by a left forward end point of the offset measuring board 1 when the board stopper 12 is located in the left forward as viewed along the direction of advance of the offset measuring board 1, a left rearward end point of the offset measuring board 1 when the board stopper 12 is located in the left rearward as viewed along the direction of advance of the offset measuring board 1, a right forward end point of the offset measuring board 1 when the board stopper 12 is located in the right forward as viewed along the direction of advance of the offset measuring board 1, or a right rearward end point of the offset measuring board 1 when the board stopper 12 is located in the right rearward as viewed along the direction of advance of the offset measuring board 1. Besides, without being limited to end points only, any arbitrary points of the offset measuring board 1 may be used as the program reference position 16.

Furthermore, it is usually enough to recognize only one recognition through hole 3. However, without being limited to this, it is also possible to recognize the one recognition through hole 3 plus two recognition through holes 3 adjacent thereto, in total three places, and further determine a straight line that connects one recognition through hole 3 and one of the other two recognition through holes 3 adjacent thereto to each other, as well as a straight line that connects the one recognition through hole 3 and the other of the two recognition through holes 3 adjacent thereto to each other, so that information as to the degree of orthogonality between the two straight lines can be obtained.

In addition, by combining arbitrary embodiments out of the above various embodiments as required, effects of those individual embodiments can be fulfilled.

According to the present invention, since the offset measuring board is formed of a metal plate having a recognition mark at least in proximity to one corner portion thereof, a face of the offset measuring board to be positionally restricted by the board stopper, for example, the front face or the rear face, and faces of the offset measuring board to be positioned and held, for example, both side faces thereof can be formed with low cost and high precision by, for example, pressing, cutting, laser beam machining, wire cutting, or other processing, and moreover as the recognition mark, for example, a through hole can be formed within the recessed portion with low cost and high precision. As a result of this, the face of the offset measuring board to be positionally restricted by the board stopper, for example, its front face or rear face can be formed with high precision for its planarity, and moreover the faces to be positioned and held, for example, both side faces can be formed with high precision for their parallelism while high degrees of orthogonality of the front face or rear face to both side faces can be obtained with high precision. In this connection, it is important to finish with high precision the planarity of the face of the offset measuring board to be positionally restricted by the board stopper, for example, its front face or rear face, which largely affects the positional precision in stopping the board by contact of its front face or rear face with the board stopper. Also, the parallelism between the faces of the offset measuring board to be positioned and held, for example both side faces thereof, largely affects the positioning and holding of the offset measuring board by pinching the offset measuring board with a positioning device, where poor parallelism precision would cause the positional precision of the recognition mark to also deteriorate due to the positioning and holding by pinching the board with the positioning device. Further, the degrees of orthogonality of the front face or rear face to both side faces of the offset measuring board largely affect the coordinate precision in the X- and Y-directions.

In contrast to this, when an offset measuring board having a similar construction is made from a material other than metals, for example, glass, it is impossible with glass to form the recessed portions or the recognition through holes by cutting or other work, making it difficult to form the offset measuring board. Also, in the case of a board made of a material other than metals, for example, glass-epoxy resin, it is difficult to form the front face or rear face and both side faces with high precision in terms of material properties, and moreover the material itself is flexure-prone. Therefore, even if the board is brought into contact with the board stopper so as to be stopped at the component mounting position, a high-precision positioning and holding of the board could not be achieved because of the poor planarity of the front face that makes contact with the board stopper, which causes a poor parallelism between the two side faces which matters in pinching the board by both-side support rails after the contact and stop of the board, and also because of poor degrees of orthogonality between the side faces and the front face.

However, in the case where, as in the present invention, the offset measuring board is formed from metal, where its front face or rear face and both side faces are formed by the aforementioned processing as described above and where the recessed portions and the through holes are formed by, for example, end mill or other cutting work, it becomes possible to remarkably improve the planarity of the front face or rear face which is to be brought into contact, and thereby stopped, with the board stopper, the degree of parallelism between both side faces which are to be pinched by the positioning device after the contact and stop by the board stopper, and the precision of the degrees of orthogonality between the side faces and the front face or rear face, as compared with the board of glass-epoxy resin.

Also, since the offset measuring board is less flexure-prone than boards of resin by virtue of its being made of metal, and since the face of the offset measuring board to be brought into contact, and thereby stopped, with the board stopper can be formed by cutting work as described above, the offset measuring board can be finished with higher precision than boards of resin. Thus, the offset measuring board, when positioned at the component mounting position after being stopped by the board stopper, can be positioned and held with higher precision, where the positioning precision can be improved, for example, up to about $1/100$ mm in terms of positioning precision error.

Besides, as the recognition mark is located in proximity to one corner portion closest to the board stopper in the component mounting position, using this recognition mark makes it possible to further improve the offset measuring precision.

Furthermore, in the case where a recognition through hole is formed as the recognition mark in such a way not that the recognition through hole is not formed alone in the offset measuring board, the recessed portion. which is larger in inner diameter than the recognition through hole is formed before the recognition through hole is formed within the recessed portion. The inner wall of the recognition through hole can be made less recognizable by reducing the thickness of the part where the recognition through hole is formed, based on the arrangement that with the field of view of the recognition device that recognizes the recognition through hole, for example a board recognition camera, set within the recessed portion, the recognition through hole is formed at a part within the recessed portion and quite smaller in thickness with respect to the thickness of the whole offset measuring board. As a result of this, the profile of the opening of the recognition through hole on its bottom-face side can be recognized clearly and with high precision, so that the recognition precision can be improved, and moreover that the program reference position can be obtained with higher precision.

Also, as compared with the case where the reference pin of the reference-pin insertion through hole is recognized by the board recognition camera, the need for forming the reference-pin insertion through holes is eliminated so that labor and cost for processing can be reduced, and moreover the need for providing the reference pins as well as the need for adjusting the reference pins in model changes of the board can also be eliminated.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A component-mounting-apparatus offset measuring board for use in measuring an offset of a component mounting apparatus which mounts a component onto a board positioned in a component mounting position by a positioning device, wherein the component-mounting-apparatus offset measuring board is formed of a rectangular or square metal plate which can be positioned in the component mounting position by the positioning device and which has a recognition mark at least in proximity to one corner portion thereof, wherein when the board is stopped at the component mounting position by contact with a board stopper of the positioning device, the recognition mark is positioned in proximity to a corner portion closest to the board stopper in the component mounting position, and wherein a face of the board with which the board stopper makes contact to stop the board is formed by processing.

2. A component-mounting-apparatus offset measuring board for use in measuring an offset of a component mounting apparatus which mounts a component onto a board positioned in a component mounting position by a positioning device, wherein the component-mounting-apparatus offset measuring board is formed of a rectangular or square metal plate which can be positioned in the component mounting position by the positioning device and which has a recognition mark at least in proximity to one corner portion thereof, wherein the rectangular or square metal plate has a recessed portion formed at least in proximity to one corner portion thereof, and a recognition through hole which is positioned within the recessed portion, the recognition through hole having a smaller inner diameter than the recessed portion and a black bottom face to serve as a recognition mark.

3. A component-mounting-apparatus offset measuring boar according to claim 2, wherein a depth of the recessed portion is greater than a depth of the recognition through hole.

4. A component-mounting-apparatus offset measuring board for use in measuring an offset of a component mounting apparatus which mounts a component onto a board positioned in a component mounting position by a positioning device, wherein the component-mounting-apparatus offset measuring board is formed of a rectangular or square metal plate which can be positioned in the component mounting position by the positioning device and which has a recognition mark at least in proximity to one corner portion thereof, wherein a front face, a rear face and both side faces of the rectangular or square metal plate are formed by processing.

5. A method for measuring an offset of a component mounting apparatus in a component mounting apparatus which mounts a component onto a board positioned in a component mounting position by a positioning device, the method comprising:

positioning an offset measuring board in the component mounting position by the positioning device, the offset measuring board being formed of a rectangular or square metal plate having a recognition mark at least in proximity to one corner portion thereof;

recognizing the recognition mark to obtain coordinate information as to the recognition mark;

based on the obtained coordinate information as to the recognition mark and coordinate information as to a range from the recognition mark to one corner portion of the offset measuring board closest to the recognition mark, obtaining position coordinate information as to the one corner portion of the offset measuring board; and comparing the obtained position coordinate information as to the one corner portion of the offset measuring board with coordinate information as to an original position of the one corner portion of the offset measuring board preliminarily set as the positioning device to thereby determine offset information therebetween.

6. A method for measuring an offset of a component mounting apparatus according to claim 5, wherein:

in positioning the offset measuring board to the component mounting position by the positioning device, the offset measuring board is hit against a board stopper to stop the offset measuring board at the component mounting position; and in recognizing the recognition mark to obtain the coordinate information as to the recognition mark, the recognition mark in proximity to a corner portion closest to the board stopper in the component mounting position is recognized.

7. A method for measuring an offset of a component mounting apparatus according to claim 5, wherein:

in recognizing the recognition mark to obtain the coordinate information as to the recognition mark, a recognition through hole which is positioned within a recessed portion formed at least in proximity to one corner portion of the offset measuring board and which is smaller in inner diameter than the recessed portion and has a black bottom face is recognized as the recognition mark.

* * * * *

UNITED STATES PATENT AND TRADEMARK OFFICE
CERTIFICATE OF CORRECTION

PATENT NO. : 6,785,008 B2
DATED : August 31, 2004
INVENTOR(S) : Hiroshi Uchiyama et al.

It is certified that error appears in the above-identified patent and that said Letters Patent is hereby corrected as shown below:

<u>Title page,</u>
Item [56], References Cited, change "5,717,575 A * 2/1998 Copelane et al. ….. 324/158.1" to -- 5,717,575 A * 2/1998 Copeland et al. ….. 324/158.1 --.

<u>Column 13,</u>
Line 22, change "portion." to -- portion, --.
Line 27, change "boar" to -- board --.

Signed and Sealed this

Ninth Day of August, 2005

JON W. DUDAS
*Director of the United States Patent and Trademark Office*